(12) United States Patent
Takizawa et al.

(10) Patent No.: US 7,382,829 B2
(45) Date of Patent: Jun. 3, 2008

(54) CONSTITUTION OF A RECEIVER IN AN ULTRA-WIDEBAND WIRELESS COMMUNICATIONS SYSTEM

(75) Inventors: Kenichi Takizawa, Koganei (JP); Ryuji Kohno, Koganei (JP)

(73) Assignee: National Institute of Information and Communications Technology Incorporated Administrative Agency, Tokyo (JP)

( * ) Notice: Subject to any disclaimer, the term of this patent is extended or adjusted under 35 U.S.C. 154(b) by 636 days.

(21) Appl. No.: 10/936,583

(22) Filed: Sep. 9, 2004

(65) Prior Publication Data

US 2005/0105649 A1 May 19, 2005

(30) Foreign Application Priority Data

Nov. 18, 2003 (JP) ............................. 2003-387851

(51) Int. Cl.
*H03K 7/08* (2006.01)
*H03M 13/03* (2006.01)

(52) U.S. Cl. ...................................... 375/238; 714/788
(58) Field of Classification Search ................ 375/238, 375/239; 714/787, 788
See application file for complete search history.

(56) References Cited

OTHER PUBLICATIONS

Naotake Yamamoto, et al., "Performance Evaluation of Internally Low Rate Turbo Coded UWB-IR Systems", The Institute of Electronics, Technical Report of IEICE., vol. 102, No. 670, Mar. 7, 2003, pp. 135-140 (with English Abstract).
Ken-ichi Takizawa, et al., "Iterative Decoding and Demodulation for Parallel Combinatorial Spread Spectrum Systems", The Institute of Electronics, Technical Report of IEICE., vol. 100, No. 656, Mar. 7, 2001, pp. 117-122 (with English Abstract).
Rupert Herzog, et al., "Iterative Decoding and Despreading improves CDMA-Systems using M-ary Orthogonal Modulation and FEC", IEEE International Conference on Communications, Jun. 1997, pp. 909-913.
Stephan ten Brink, "Iterative Decoding for Multicode CDMA", IEEE Vehicular Technology Conference, vol. 3, May 1999, pp. 1876-1880.
Rick Roberts, "03154r2P802-15_TG3a XtremeSpectrum CFP Document", IEEE P802.15 Wireless Personal Area Networks, May 2003, pp. 1-142.
Naotake Yamamoto, et al., "Adaptive Internally Turbo-Coded Ultra Wideband-Impulse Radio (AITC-UWB-IR) System", IEEE International Conference on Communications 2003, May 2003, pp. 3535-3539.
Joachim Hagenauer, "The Turbo Principle: Tutorial Introduction and State of the Art", International Symposium on Turbo Codes, Sep. 1997, pp. 1-11.

*Primary Examiner*—Kevin Kim
(74) *Attorney, Agent, or Firm*—Oblon, Spivak, McClelland, Maier & Neustadt, P.C.

(57) ABSTRACT

This invention has as its object to implement the constitution of a receiver that receives signals sent by performing multi-valued pulse modulation and performs iterative decoding. The constitution includes: (1) a bank of pulse correlators that achieves correlation with all predetermined sent pulse waveforms, (2) a pulse demapper that calculates the log likelihood ratio for each bit of the interleaved code word from said pulse correlator outputs and a priori information for each bit, (3) a deinterleaver that performs deinterleaving on the output from said pulse demapper, (4) a decoder that calculates likelihood information for the deinterleaved code word bits and information bits, respectively, (5) an interleaver that interleaves the output of the decoder in the same manner as on the sending side, and (6) a feedback circuit that provides feedback of the output of said interleaver as a priori probability to the pulse demapper.

3 Claims, 6 Drawing Sheets

CONSTITUTION OF A RECEIVER IN AN ULTRA-WIDEBAND WIRELESS COMMUNICATIONS SYSTEM

BACKGROUND OF THE INVENTION

1. Field of the Invention

The present invention relates to a receiver in an ultra-wideband (UWB) wireless communications system.

2. Description of the Prior Art

UWB wireless communication, which uses a signal pulse width on the order of several nanoseconds, is attracting attention as wireless communication that can achieve high-speed data transmission with low power consumption. UWB wireless communication is susceptible to the effects of timing jitter arising on the receiving side, and there is a possibility that the transmission error rate may deteriorate greatly due to interference among pulse signals arising due to the use of large numbers of devices. Conceivable methods of improving this transmission error rate include the application of channel encoding. Up until now, Reed-Solomon encoding, convolutional encoding and turbo encoding have been studied as the channel encoding in UWB wireless communications, and convolutional encoding and turbo encoding have been shown to be effective.

Figure 4:
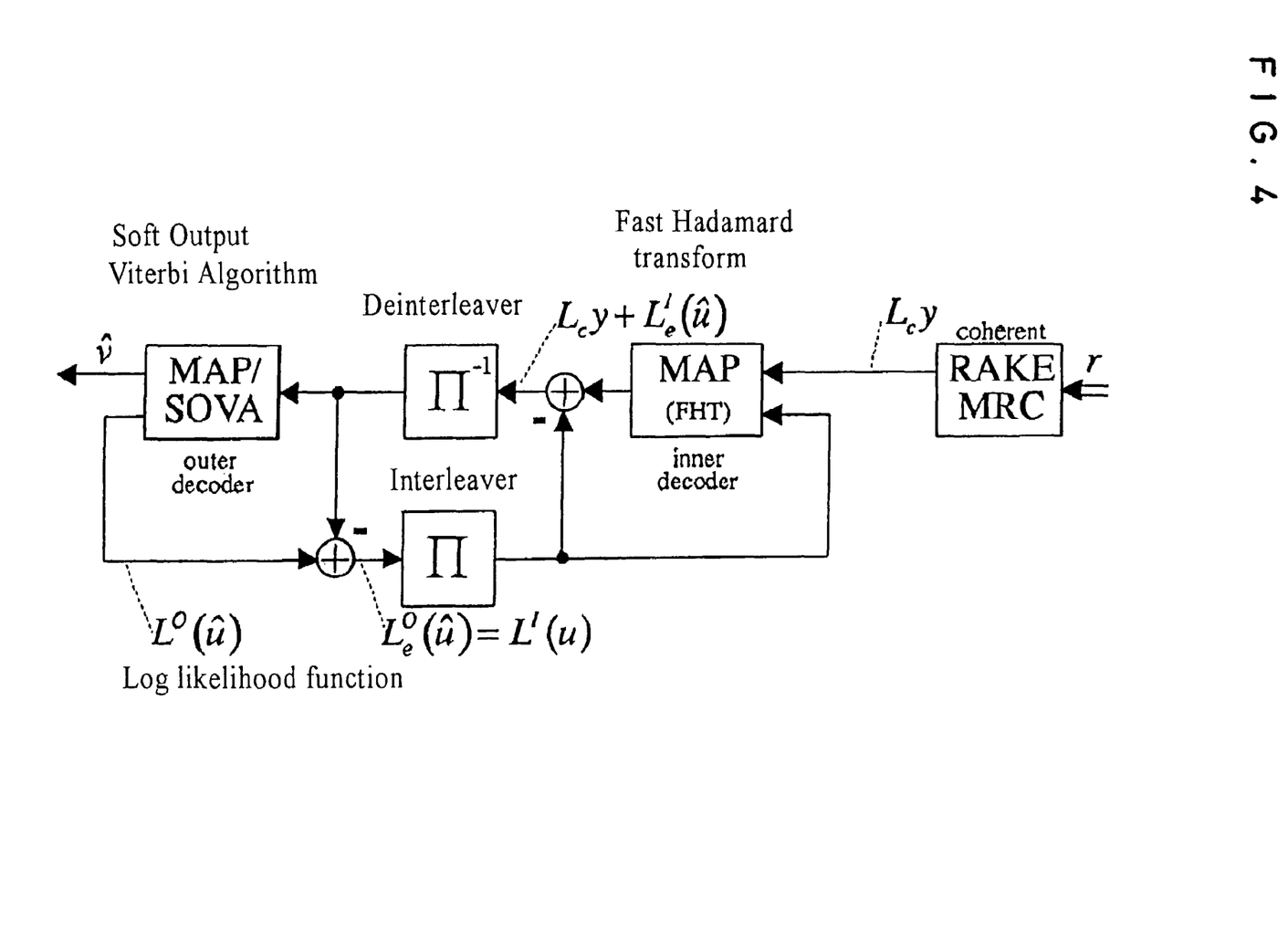
FIG. 4 is a block diagram illustrating a first constitution of a conventional encoding method.

Reference Document 1 (R. Herzog, A. Schmitbauer, and J. Hagenauer, "Iterative Decoding and Despreading Improves CDMA-Systems using M-ary Orthogonal Modulation and FEC," IEEE International Conference on Communications, Montreal, Canada, pp. 909-913, June 1997.) reports an iterative decoding method of the constitution shown in FIG. 4. This reported decoding method is a constitution wherein the turbo principle presented in Reference Document 5 (J. Hagenauer, "The turbo principle: Tutorial introduction and state of the art," International Symposium on Turbo Codes, Brest, France, pp. 1-11, September 1997.) is used as a decoding method for improving the transmission error rate in the IS-95(B) Code Division Multiple Access system using narrowband signals. In FIG. 4, the output from a Fast Hadamard Transformer (FHT) is sent to a channel decoder via a deinterleaver, and in the decoder decoding is performed based on the Maximum A posteriori Probability (MAP) decoding algorithm or the Soft Output Viterbi Algorithm (SOVA), and the output is fed back to the FHT as a priori information. Decoding of the input and output from each FHT and is performed using the log likelihood ratio which is soft information.

Figure 5:
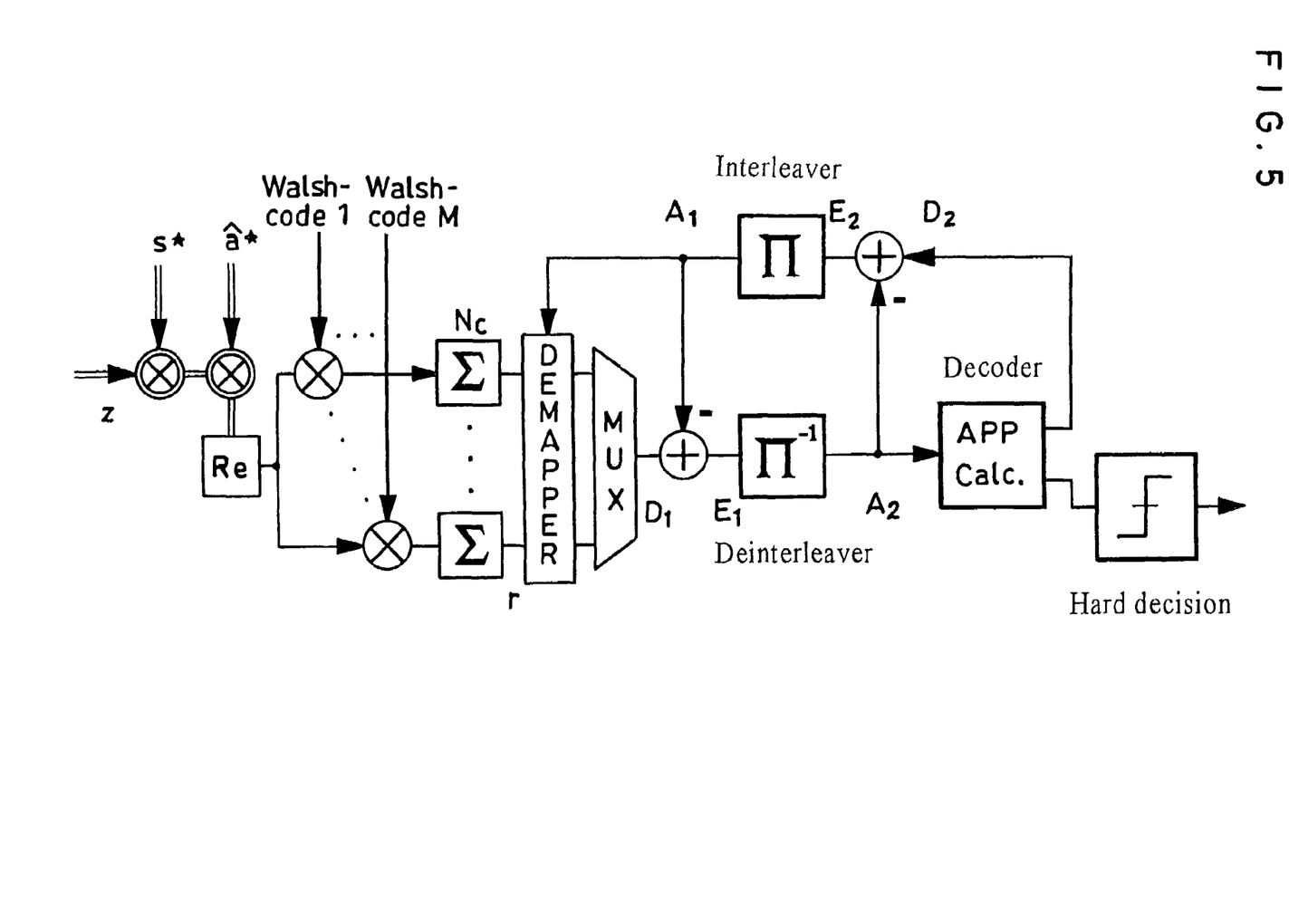
FIG. 5 is a block diagram illustrating a second constitution of a conventional encoding method.

In addition, Reference Document 2 (S. ten Brink, "Iterative Decoding for Multicode CDMA," IEEE Vehicular Technology Conference, Vol. 3, pp. 1876-1880, May 1999.) reports the iterative decoding method illustrated in FIG. 5. This reported decoding illustrates a method wherein iterative decoding is performed on the receiving side by using the turbo principle illustrated in Reference Document 5 in narrowband multicode CDMA where a plurality of spread codes are used to perform parallel transmission. Regarding the constitution of FIG. 5, the likelihood of information transmitted in each spread signal is calculated in the code demapper, and this likelihood information is sent to the decoder via a deinterleaver, and in the decoder, decoding is performed based on an a posteriori probability (APP) decoding algorithm, and the output is fed back to the code decoder as a priori information. Decoding of the input and output from each code demapper and decoder is performed using the log likelihood ratio which is soft information.

The conventional decoding methods described above are ones intended to improve the transmission error rate characteristics of iterative decoding on the receiver side when using the turbo principle in narrowband Code Division Multiple Access (CDMA). Each consists of a block that calculates the likelihood of transmitted spread codes along with a deinterleaver, decoder and interleaver, thus achieving iterative decoding by the feedback of likelihood information from the decoder via the interleaver.

In addition, Reference Document 3 (03154r2P802-15_TG3a Xtreme Spectrum CFP Presentation. Proposal for IEEE 802.15.3a. May 2003.) presents a study of the application of convolutional code or Reed-Solomon code to UWB wireless communication. On the receiving side, hard decisions are made on each pulse signal and decoding is performed on each code. Since hard decisions are made on the receiver side, the improvement of the transmission error rate characteristics becomes smaller than in the case of using iterative decoding based on a soft-input/soft-output algorithm.

Figure 6:
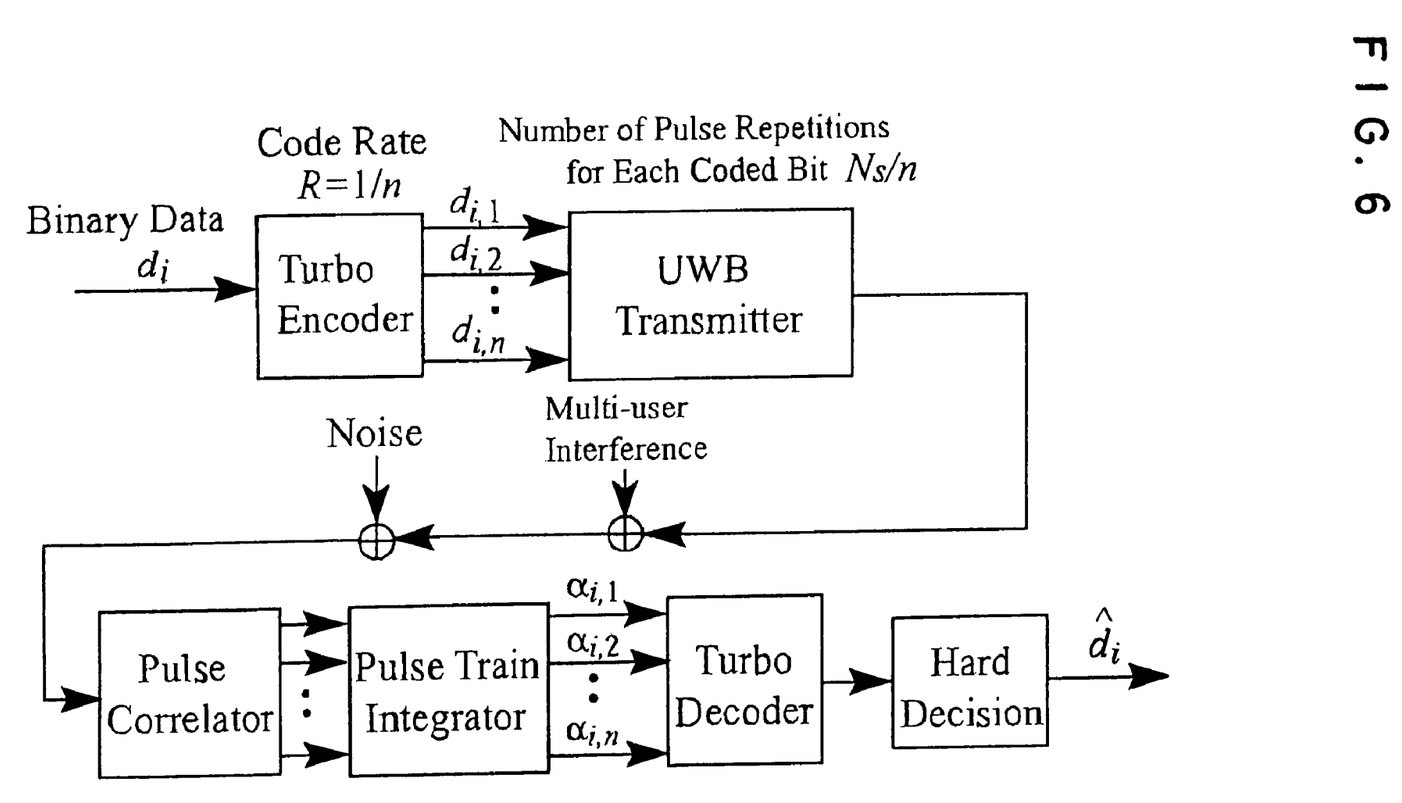
FIG. 6 is a block diagram illustrating a third constitution of a conventional encoding method.

In addition, Reference Document 4 (N. Yamamoto and T. Ohtsuki, "Adaptive internally turbo-coded ultra wideband-impulse radio (AITC-UWB-IR) system," IEEE International Conference on Communications 2003, pp. 3535-3539, May 2003.) applies turbo codes to UWB wireless communications. As shown in FIG. 6, the receiving side consists of a pulse correlator, integrator and turbo decoder. In this method of Reference Document 4, recalculation of the likelihood information on received pulses is not performed using a priori information from the decoder.

The present invention has as its object to provide a receiver that is able to improve the transmission error rate in an arbitrarily encoded UWB wireless communications system.

SUMMARY OF THE INVENTION

The present invention provides a receiver comprising a pulse demapper that, based on an a posteriori probability decoding algorithm, calculates soft likelihood information for each bit from a priori information with respect to a sent pulse waveform and received signals; a first interleaver that uses on a sending side an output from the pulse demapper to make an interleaving operation; a deinterleaver that makes a deinterleaving operation; a channel decoder that calculates likelihood information for each of code word bits and likelihood information for information bits, respectively, from deinterleaved likelihood information; a second interleaver that interleaves an output of the channel decoder with respect to the code words; and a feedback circuit that provides feedback to the pulse demapper, of an output of the second interleaver as an a priori information for use in a second and subsequent iterations of decoding.

In the receiver in an ultra-wideband wireless system just mentioned above, the deinterleaver deinterleaves external information calculated by said pulse demapper and found by subtracting the a priori probability for each bit from a log likelihood ratio for each bit of the interleaved code words, the deinterleaved external information being for use in said channel decoder in decoding as the a priori probability with respect to the code word bits.

In the receiver in an ultra-wideband wireless system just mentioned above, the second interleaver interleaves external information that is found by subtracting the a priori probability from the logo likelihood information ratio for the code word, the interleaved external information being for being provided as feedback to the pulse demapper and used as the a priori probability in a second and subsequent iterations of decoding.

Figure 1:
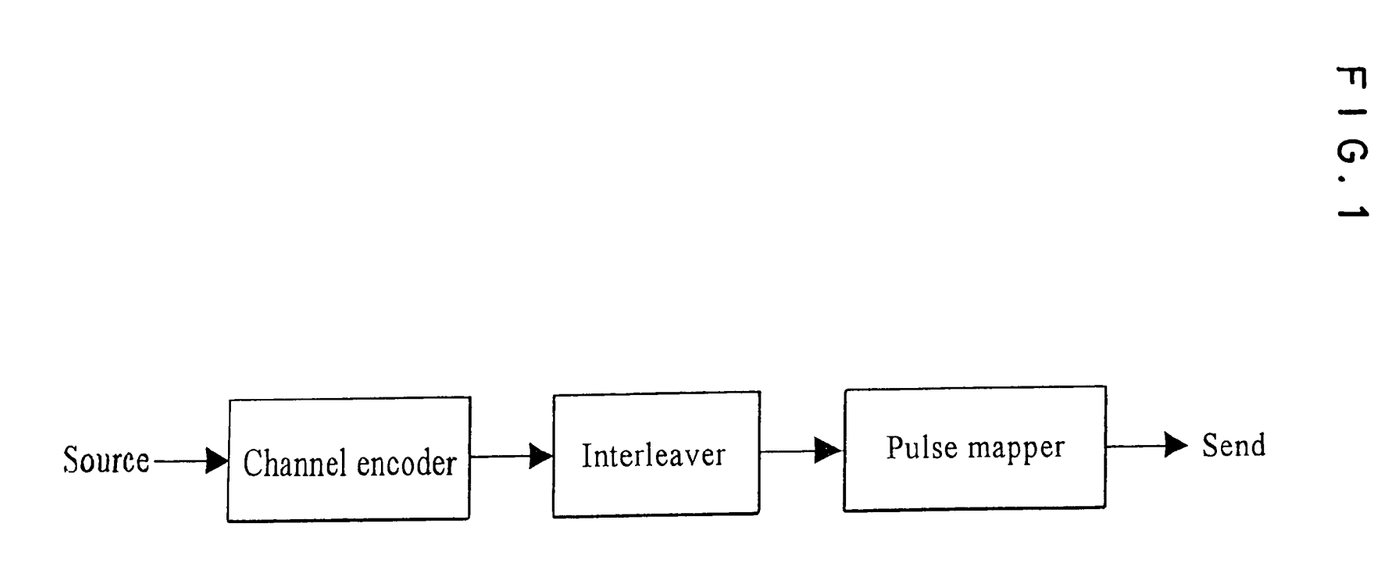
FIG. 1 is a block diagram illustrating the transmitting-side constitution in a UWB wireless system according to the present invention.

By using a receiver according to this invention, it is possible to improve the transmission error rate characteristics by iterative processing in the receiver of any UWB wireless communications system constituted as shown in FIG. 1. As a result, one can expect an increased transmission range and an increased user capacity. In addition, iterative decoding can improve the transmission error rate characteristics proportionally to the increase in computational cost due to iteration. Thereby, it is also possible to adapt the computational cost by increasing or decreasing the number of iterations proportionally to the transmission error rate or throughput required.

In addition, with the present invention, it is possible to reduce the loss in encoding gain due to hard decisions by using soft likelihood information. In addition, the present invention is effective not only with respect only to a specific combination of pulse mapping and channel coding, but rather it can be applied to any UWB wireless communications system constituted as shown in FIG. 1 and improve its transmission error rare characteristics.

DESCRIPTION OF THE PREFERRED EMBODIMENT

The present invention discloses a method of improving the transmission error rate characteristics by performing iterative decoding between the pulse demapper and decoder in the receiver of a channel-encoded UWB wireless communications system. Iterative decoding is a decoding method that is able to successively improve the error rate characteristics by using soft likelihood information and performing the exchange of likelihood information between the pulse demapper and channel decoder via the deinterleaver or interleaver. The likelihood information output from the pulse demapper is calculated from a priori information (a priori probability) with respect to the each codeword bit and the received pulse signals. This a priori information is related to likelihood information with respect to the sent pulse waveforms, and in the event that this a priori information is not present, then all possibly sent waveforms take the same probability. The likelihood information calculated in the pulse demapper is exchanged with the channel decoder via the deinterleaver. In the channel decoder, decoding is performed and the soft likelihood information is calculated based on the received likelihood information. The calculated likelihood information is fed back to the pulse demapper via the interleaver and used as a priori information in the pulse demapper. By repeating this operation, iterative decoding is achieved between the pulse demapper and channel decoder. After a stipulated number of iterations of decoding, a hard decision on the likelihood information is made in the decoder based on the sign code thereof, to obtain the received bit.

First, the sending-side constitution in an ultra-wideband wireless system will be described using FIG. 1. As data, an information bit sequence $u=\{u_1, \ldots, u_k, \ldots, u_k\}$ is encoded with an arbitrary channel encoding by a channel encoding unit 11 to obtain a code word $c=\{c_1, \ldots, C_n, \ldots, c_N\}$. An interleaver 12 performs bit-level interleaving on this code word c. The interleaver size is set to the same N bits as the code word length. The interleaved code word $c'=\{c'_1, \ldots, c'_n, \ldots, c'_N\}$ is mapped symbol-wise by a pulse mapper 13 into corresponding pulse signals, taking $K_p$ bits to be 1 symbol. Taking M to be the types of sent pulse waveforms, the amount of information that can be sent per pulse signal is given by $K_p = \log_2 M$ bits. The pulse signal corresponding to the $i^{th}$ symbol is given as s(i). In addition, $P=\{s_1, \ldots, s_m, \ldots, s_M\}$ is the set of M types of sent pulse waveform. Each pulse signal Sm is a pulse waveform having the pulse time-width $T_F$. The code word c'-mapped pulse signal train $S=\{s(1), \ldots, s(i), \ldots, s(N/K_p)\}$ is sent to the channel through a band-limit filter.

Figure 2:
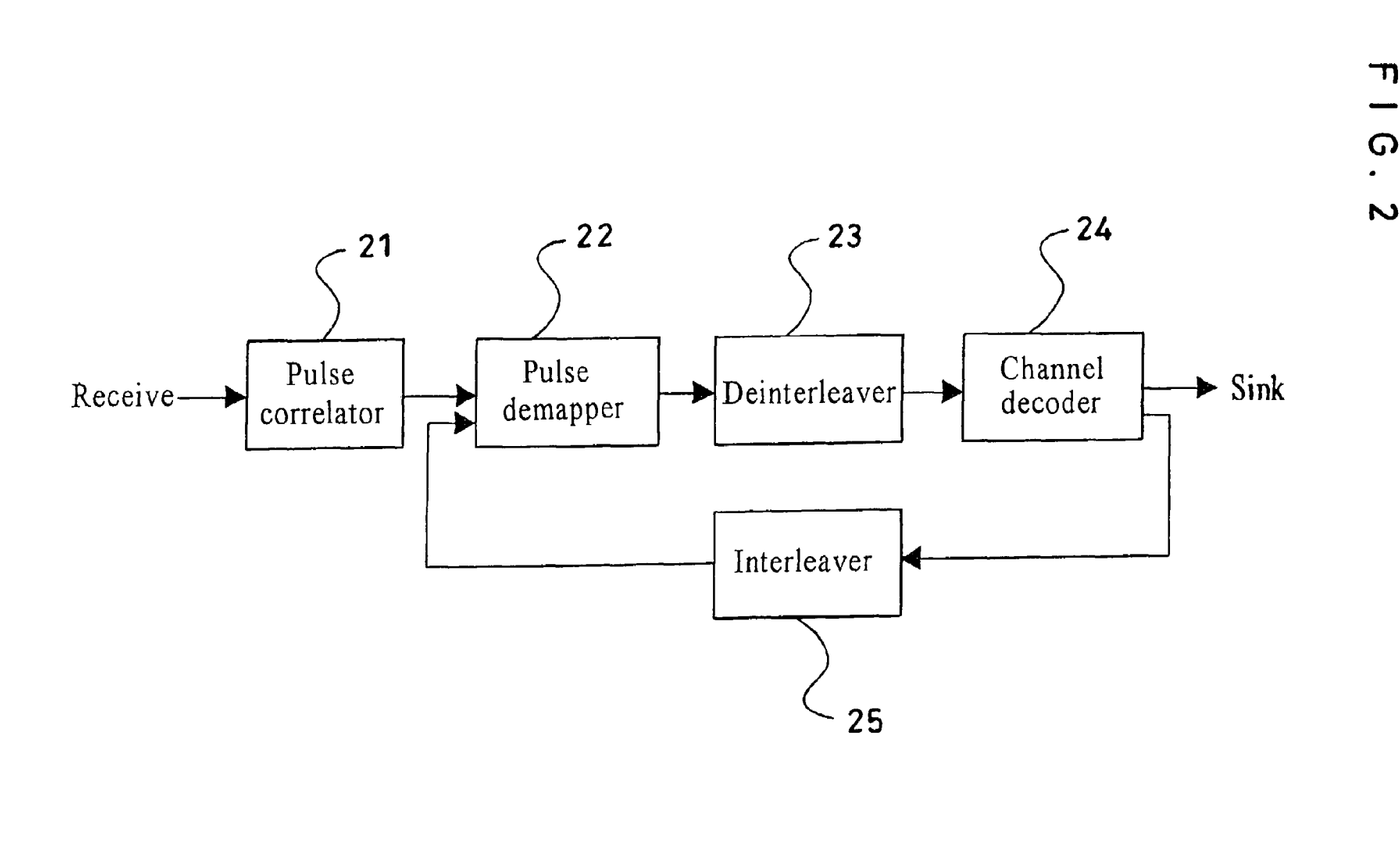
FIG. 2 is the receiving-side constitution in a UWB wireless system according to the present invention.

FIG. 2 illustrates the receiver-side constitution in a UWB wireless system that uses iterative decoding. The received pulse signal $r_i(t)$ for the $i^{th}$ symbol is first fed to the pulse correlator 21, which consists of M correlators corresponding to the pulses $s_m (m=1, \ldots M)$ in P. The output from the $m^{th}$ correlator for the $i^{th}$ received symbol is given as $$z_{i,m} = \int_{t=0}^{T_F} s_m(t) r_i(t) dt \qquad (1)$$

Here, $T_p$ denotes the time duration of the pulse.

Likelihood information L(c') for the code word c' is calculated in a pulse demapper 22. The calculation of likelihood information is performed symbol-wise, with $L(c'_{i \cdot K_p})$ being calculated based on a priori information with respect to the the code word bits $c'_{(i-1)K_p+1}$ to $c'_{i \cdot K_p}$ from these $K_p$ bits of likelihood information $L(c'_{(i-1)K_p+1})$ and the received pulse signal R. The a priori information is given by an a priori probability $L_a(c')$ fed back from the channel decoder 4. Thus, there is no a priori probability during the first decoding and so the calculation of a priori information is performed assuming $L_a(c')=0$.

The extrinsic information $L_e(c')$ found by subtracting $L_a(c')$ from $L(c')$ is deinterleaved by a deinterleaver 23 and then used in a channel decoder 24 in the decoding of the channel code as the a priori probability $L_a(C)$ with respect to the code word bits.

In the channel decoder 24, the likelihood information $L_a(c)$ and L(u) with respect to the code word c and information bit u are calculated using a soft-input/soft-output decoding algorithm, such as the maximum a posteriori probability decoding algorithm or the soft output Viterbi algorithm. In addition, the extrinsic information $L_e(c)$ found by subtracting the likelihood information in the decoder $L_a(c)$ from the likelihood information L(c) is interleaved by an interleaver 25 and then fed back to the pulse demapper 22 and used as the a priori probability $L_a(c')$ in the second and subsequent iterations of decoding. The interleaver 25 provided in the feedback circuit is the same as that used on the sending side.

After the iterative decoding is performed the stipulated number of times, the hard-decision decoded bit is obtained by making a decision on the sign code of the likelihood information L(u).

The method of calculating the likelihood information in the pulse demapper 22 will now be presented. Assuming that the channel is an additive white Gaussian noise (AWGN) channel, if a decoding algorithm using the a posteriori probability is used, then the likelihood information $L(c'_n)$ of each bit $c'_n$ output from the pulse demapper is represented by Equation (2).

$$L(c'_n) = \log \frac{\sum_{c'_n=1,s_m} P(s_m \mid r_i)}{\sum_{c'_n=0,s_m} P(s_m \mid r_i)} = \log \frac{\sum_{c'_n=1,s_m} P(r_i \mid s_m) P(s_m)}{\sum_{c'_n=0,s_m} P(r_i \mid s_m) P(s_m)} \quad (2)$$

$$= \log \left[ \sum_{c'_n=1,s_m} P(r_i \mid s_m) P(s_m) \right] - \log \left[ \sum_{c'_n=0,s_m} P(r_i \mid s_m) P(s_m) \right]$$

$$\approx \log \left[ \max_{c'_n=1,s_m} \{ P(r_i \mid s_m) P(s_m) \} \right] - \log \left[ \max_{c'_n=0,s_m} \{ P(r_i \mid s_m) P(s_m) \} \right]$$

$$= \max_{c'_n=1,s_m} [\log P(r_i \mid s_m) + \log P(s_m)] - \max_{c'_n=0,s_m} [\log P(r_i \mid s_m) + \log P(s_m)]$$

Here, i is the largest integer less than $n/K_p$, and the code word bit $c'_n$ represents the corresponding symbol. In this formula, the approximation in Equation (2) is derived from the assumption that the $P(s_m)P(r_i|s_m)$ with respect to the largest pulse waveform is sufficiently larger than the other values. $P(s_m)$ is a priori information (a priori probability) for all pulse waveforms (m=1, . . . , M), which is calculated from a priori information from the $L_a(C)$ decoder. In the event that there is no a priori information, it becomes 1/M which is an equal probability for all pulse waveforms. In addition, $P(r_i|s_m)$ is a conditional probability, becoming as in Equation (3) since an AWGN channel is assumed.

$$P(r_i \mid s_m) = \prod_{t=0}^{T_F} \frac{1}{\sqrt{2\pi}\sigma} \exp\left(-\frac{|r_i(t) - s_m(t)|^2}{2\sigma^2}\right) \quad (3)$$

$$= Const \cdot \exp\left(-\frac{1}{2\sigma^2} \int_{t=0}^{T_F} |s_m(t)|^2 dt\right) \exp\left(\frac{1}{\sigma^2} \int_{t=0}^{T_F} s_m(t) r_i(t) dt\right)$$

$$= Const \cdot \exp\left(-\frac{E_m}{2\sigma^2} + \frac{1}{\sigma^2} \int_{t=0}^{T_F} s_m(t) r_i(t) dt\right)$$

$$= Const \cdot \exp\left(-\frac{E_m}{2\sigma^2} + \frac{z_{i,m}}{\sigma^2}\right)$$

The Const in Equation (3) is a constant such that $P(r_i|s_m)$ becomes the same value with respect to all pulse waveforms. The electrical power of each pulse waveform is given by $E_m = \int |s_m(t)|^2 dt$ and $\sigma$ is the standard deviation of noise. In Equation (3), if the electrical power of each pulse waveform is taken to be equal, then the term $E_m$ can be included in Const, giving Equation (4).

$$P(r_i \mid s_m) = Const \cdot \exp\left(\frac{z_{i,m}}{\sigma^2}\right) \quad (4)$$

Here, $z_{i,m}$ is the correlator outputs given in Equation (1). In Equation (4), if the Const which becomes the same value in each of the pulse waveforms is ignored, substituting into Equation (2) gives Equation (5).

$$L(c'_n) \approx \max_{c'_n=1,s_m} \left(\log P(s_m) + \frac{z_{i,m}}{\sigma^2}\right) - \max_{c'_n=0,s_m} \left(\log P(s_m) + \frac{z_{i,m}}{\sigma^2}\right) \quad (5)$$

Here, $\log P(s_m)$ is a priori information (a priori probability) for all pulse waveforms. Starting from the second iteration of decoding, for the $i^{th}$ symbol, $\log P(s_m)$ is calculated as follows since the likelihood information from the decoder is the log likelihood ratio $L_a(c'_n) = \log \{P(c'_n=1)/P(c'_n=0)\}$.

$$\log P(s_m) = \log P(c'_m \mid \text{Mapping } (c'_m) = s_m) \quad (6)$$

$$= -\sum_{n_m^0} L_a\left(c'_{(i-1)K_p + n_m^0}\right) + Const$$

Here, $c'_m$ is a K-bit string transferred to the pulse waveform $s_m$ in mapping. In addition, mm represents the bit position that is 0 in $c'_m(n_m^0 \in \{1, \ldots, K_p\})$. The Const in Equation (6) is different from the one in Equation (4) but it is a constant common to all pulse waveforms. If the formula represented by this Equation (6) is substituted into Equation (5), ignoring the Const of Equation (6), this becomes as follows.

$$L(c'_n) = \max_{c'_n=1,s_m} \left\{ -\sum_{n_m^0} L_a\left(c'_{(i-1)K_p + n_m^0}\right) + \frac{z_{i,m}}{\sigma^2} \right\} - \quad (7)$$

$$\max_{c'_k=0,s_m} \left\{ -\sum_{n_m^0} L_a\left(c'_{(i-1)K_p + n_m^0}\right) + \frac{z_{m,m}}{\sigma^2} \right\}$$

Thus, the likelihood information $L(c'_n)$ is found by addition and maximum-value calculation using the correlator output $z_{i,m}$ weighted by the noise variance $\sigma^2$ and the a priori probability $L_a(c'_n)$ fed back from the decoder. The likelihood information indicated by Equation (8), found by subtracting the a priori probability $L_a(c'_n)$ from this likelihood information, is sent to the decoder via the deinterleaver.

$$L_e(c'_n) = L(c'_n) - L_a(c'_n) \quad (8)$$

Figure 3:
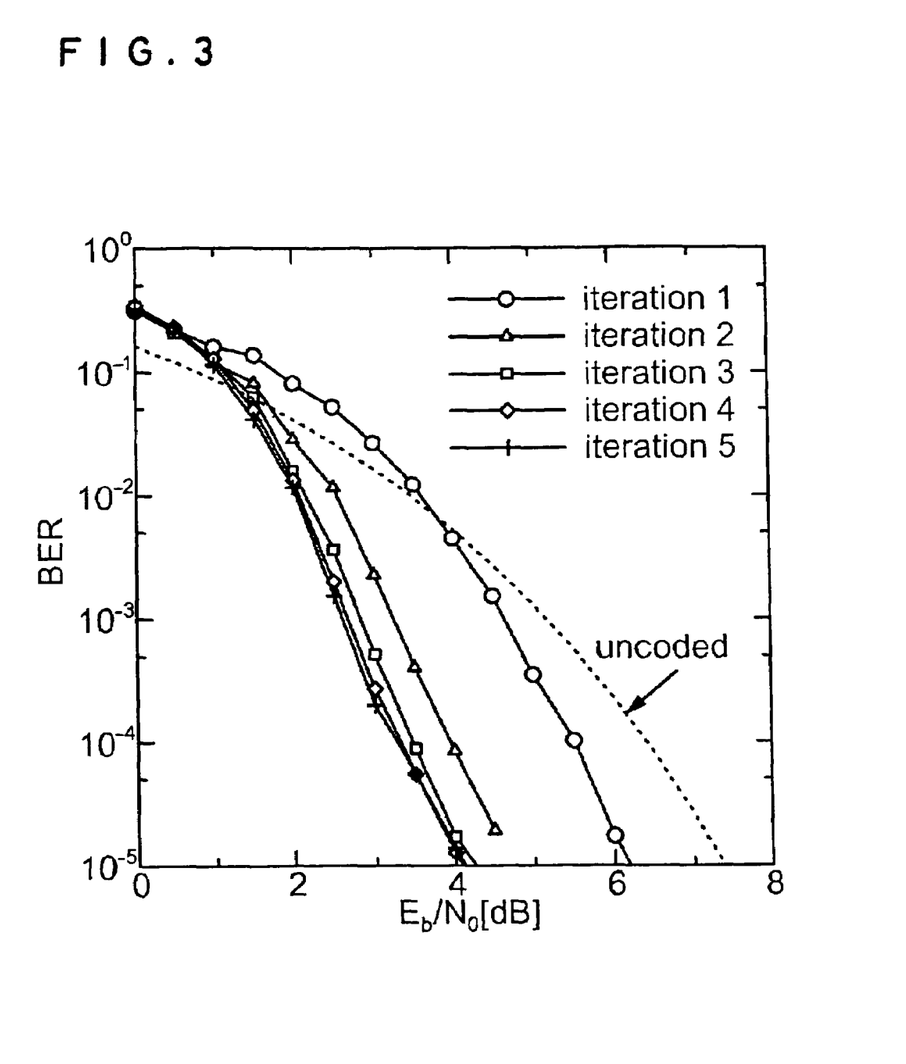
FIG. 3 is a diagram illustrating the results of simulation of the present invention in an AWGN channel.

Simulation Results:

Table 1 presents the simulation parameters. In addition, FIG. 3 presents the results of a simulation in an AWGN channel. FIG. 3 presents the bit error rate (BER) as a function of the signal-to-noise power ratio per bit ($E_b/N_0$) as a result of up to five iterations of decoding, along with the case of no encoding performed for comparison. The result of one iteration of decoding agrees with the bit error rate characteristic in the case that no iterative decoding is performed. One can see that the error rate characteristic can be successively improved by performing the iterative decoding between the pulse demapper and decoder according to the present invention. In addition, upon comparing the case of performing no encoding and the case of performing five iterations of decoding, one can see that a gain of approximately 3.2 dB is obtained in the signal-to-noise power ratio per bit required to obtain a bit error rate of $10^{-5}$. Upon comparing the result of one iteration of decoding (the case of not performing iterative decoding) and the case of performing five iterations of decoding, one can see that a gain of approximately 2.0 dB is obtained. Upon considering the free-propagation model of distance-squared attenuation, the distance at which a bit error rate of $10^{-5}$ can be obtained can be multiplied by 1.25 by five iterations of iterative decoding.

TABLE 1

Simulation parameters

| | |
|---|---|
| Channel decoding | $(5, 7)_8$ non-recursive, non-systematic convolutional code |
| Pulse modulation | M-ary Bi-orthogonal Keying (M = 8) |
| Pulse waveform | Gaussian monocycle waveform |
| Number of users | 1 |
| Channel | AWGN channel |
| Decoding algorithm | max-log MAP algorithm given by (7) |
| Interleaver | Random interleaver |

The present invention is a constitution and method of iterative decoding between the pulse demapper and decoder of channel codes in a channel-encoded UWB wireless communications system. By using approximate calculation in the pulse demapper, likelihood information can be easily calculated with the operations of addition and maximum-value calculation. In a computer simulation, when using convolutional codes, upon comparing the bit error rate characteristic in the case in which encoding is not performed against the case in which five iterations of decoding are performed, one can see that a gain of approximately 3.2 dB is obtained at a bit error rate of $10^{-5}$.

What is claimed is:

1. A receiver in an ultra-wideband wireless system that performs bit-level interleaving on code words obtained from information bit sequences encoded with a channel code and receives pulse signals that are sent as a pulse waveform in interleaved code word units, the receiver comprising:

a pulse demapper that, based on a posteriori probability decoding algorithm, pulse-level calculates soft likelihood information in the code word units for each bit from priori information with respect to the sent pulse waveform and the received pulse signals;

a deinterleaver configured to receive an output from said pulse demapper to perform a deinterleaving operation;

a channel decoder configured to decode channel code and likelihood information for each of code word bits and likelihood information for information bits, respectively, on a basis of deinterleaved likelihood information; an interleaver configured to interleave an output of the channel decoder with respect to said code words; and a feedback circuit configured to provide feedback to the pulse demapper, of an output of said interleaver as an a priori probability for use in a second and subsequent iterations of decoding the channel code.

2. A receiver in an ultra-wideband wireless system according to claim 1, wherein the deinterleaver deinterleaves external information calculated by said pulse demapper and derived by subtracting a priori probability for each bit from a log likelihood ratio for each bit of the interleaved code words, the deinterleaved external information being employed in said channel decoder in decoding the channel code as a priori probability with respect to the code word bits.

3. A receiver in an ultra-wideband wireless system according to claim 2, wherein the interleaver interleaves external information derived by subtracting the priori probability from the logo likelihood information ratio for the code word, the interleaved external information being provided as feedback to the pulse demapper and employed as the priori probability in a second and subsequent iterations of decoding the channel code.

* * * * *